(12) United States Patent
Minnis et al.

(10) Patent No.: US 7,116,965 B2
(45) Date of Patent: *Oct. 3, 2006

(54) RADIO RECEIVER

(75) Inventors: Brian J. Minnis, Crawley (GB); Paul A. Moore, Seaford (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 655 days.

This patent is subject to a terminal disclaimer.

(21) Appl. No.: 09/999,369

(22) Filed: Oct. 31, 2001

(65) Prior Publication Data

US 2002/0058491 A1    May 16, 2002

(30) Foreign Application Priority Data

Nov. 10, 2000    (GB)    .................................. 0027503.2

(51) Int. Cl.
H04B 1/26    (2006.01)
(52) U.S. Cl. ................... 455/323; 455/324; 455/552.1; 455/553.1; 455/550.1
(58) Field of Classification Search ................ 455/323, 455/324, 552.1, 553.1, 550.1; 375/322, 324, 375/328, 329, 334
See application file for complete search history.

(56) References Cited

U.S. PATENT DOCUMENTS

| | | | | |
|---|---|---|---|---|
| 5,950,119 | A * | 9/1999 | McGeehan et al. | 455/302 |
| 6,023,491 | A * | 2/2000 | Saka et al. | 375/326 |
| 6,301,312 | B1 * | 10/2001 | Limberg | 375/326 |
| 6,529,719 | B1 * | 3/2003 | Imbornone et al. | 455/302 |
| 6,678,340 | B1 * | 1/2004 | Khlat et al. | 375/350 |
| 6,683,919 | B1 * | 1/2004 | Olgaard et al. | 375/316 |
| 6,714,604 | B1 * | 3/2004 | Tsurumi et al. | 375/329 |
| 6,778,594 | B1 * | 8/2004 | Liu | 375/222 |
| 6,954,628 | B1 * | 10/2005 | Minnis et al. | 455/324 |

FOREIGN PATENT DOCUMENTS

| EP | 0797292 A1 | 9/1997 |
|---|---|---|
| WO | WO0022735 | 4/2000 |

OTHER PUBLICATIONS

By M. J. Gingell, Entitled "Single Sideband Modulation Using Sequence Asymmetric Polyphase Networks", Electronic Communications, vol. 48M Nov. 1 and 2, 1973. pp. 21-25.

* cited by examiner

*Primary Examiner*—Matthew D. Anderson
*Assistant Examiner*—Tuan Pham
(74) *Attorney, Agent, or Firm*—Aaron Waxler; Paul Im

(57) ABSTRACT

A radio receiver configurable to operate in either a low-IF or a zero-IF mode comprises a quadrature down-converter (108,110,112,114) for generating in-phase (I) and quadrature (Q) signals at an intermediate frequency and a complex filter (202) for performing image rejection filtering. One of the outputs (Q) of the filter (202) is terminated, the other (I) is passed to a non-complex ADC (206). The output from the ADC is processed digitally then a quadrature signal generator (212,214) generates quadrature-related IF signals which are passed to a down-converter (216,218) for conversion to baseband signals. By enabling analogue-to-digital conversion and channel filtering to be performed at IF on non-complex signals, significant power savings are possible. Further, the flexibility of the receiver is enhanced, enabling it to operate efficiently in both low-IF and zero-IF modes.

11 Claims, 5 Drawing Sheets

RADIO RECEIVER

The present invention relates to a radio receiver having particular, but not exclusive, application in digital communication systems such as GSM and UMTS, and to an integrated circuit comprising such a radio receiver.

Near-zero-IF receivers (also known as polyphase receivers) are known for use in radio communication systems such as GSM (Global System for Mobile communication) and DECT (Digital Enhanced Cordless Telecommunications). Such receivers provide similar performance to that of traditional superhet receivers but have the advantage of being much easier to integrate, because there is no need for off-chip channel filters. An example of a known polyphase receiver is disclosed in European Patent Application 0,797,292.

Compared with known zero-IF receivers, polyphase receivers provide a substantial improvement in performance by eliminating problems with DC offsets and generation of second order intermodulation products. A significant feature of a polyphase receiver is that complex signal processing is performed on the IF signals between the output of a front-end downconverter and the input to a demodulator, to ensure that any images of the wanted signal are adequately suppressed.

In a later variation on a low-IF receiver, analogue-to-digital conversion was performed immediately after the front-end downconverter, which allowed channel filtering to be performed entirely in the digital domain. Such a receiver is disclosed in International Patent Application WO 00/22735. This variation required increased dynamic range capability from the Analogue-to-Digital Converter (ADC), but provided increased flexibility by enabling the channel filter characteristics of the receiver to be changed in software, thereby making it significantly easier to design a multi-mode receiver.

An embodiment of such a known receiver for use with a GSM system is shown in FIG. 1 of the accompanying drawings. Radio signals are received by an antenna 102, filtered by a bandpass filter 104 and amplified by a low-noise amplifier 106. The signal is then mixed down to generate in-phase (I) and quadrature phase (Q) signals at an IF of 100 kHz (half the GSM channel spacing) by first and second mixers 108,110, which mixers are supplied with signals from a Local Oscillator (LO) 112 at their respective LO ports via a phase shifting block 114 which provides a signal with zero phase shift to the first mixer 108 and a signal with a 90° phase shift to the second mixer 110.

The I and Q signals may be filtered by a high pass filter 116 and are then supplied to a digitisation block 118, comprising a complex sigma-delta ADC incorporating a polyphase bandpass loop filter. Such an ADC is disclosed in WO 00/22735. I and Q outputs from the digitisation block 118 comprise single bit digital signals at a bit rate of 13 MHz. A polyphase bandpass filtering and decimation block 120 reduces the bit rate by a factor of 24, and the output signals from this block comprise 14-bit signals at a bit rate of 541.667 kHz. A further filtering and decimation block 122 performs low pass filtering and derotation of the signals to baseband, resulting in 15-bit output signals at the GSM bit rate of 270.833 kHz. The signals are then processed by an equalisation and demodulation block (EQ) 124, before being provided as output 126 to digital signal processing circuitry in the remainder of the receiver.

Although this latter variation is preferred for a multi-mode receiver, the need for a complex ADC having complex noise shaping, as employed in the sigma-delta ADC disclosed in WO 00/22735, is not altogether desirable. For example, if the bandwidth of the ADC and its clock speed have to be modified on changing mode then a complex ADC is more difficult to design. This is particularly the case if the required bandwidth and clock speed are at the limits of the state of the art in terms of conversion efficiency. As a further consideration, if in one or more of the receive modes the IF is set to zero, the need for a complex ADC is substantially reduced (since it is only really desirable for a low-IF receiver).

An object of the present invention is therefore to provide a receiver in which efficient use of a non-complex ADC is possible for all receive modes, whether or not the IF is zero.

According to the present invention there is provided a radio receiver comprising an input for a radio frequency signal, quadrature down-conversion means for translating the radio frequency signal to an intermediate frequency and for generating in-phase and quadrature versions of the intermediate frequency signal, complex filtering means for operating on the in-phase and quadrature signals to provide filtered in-phase and quadrature signals, analogue-to-digital conversion means for digitising only one of the in-phase and quadrature signals, means for performing digital signal processing on the digitised signal and signal generation means for operating on the processed signal to generate digital in-phase and quadrature signals.

By quantising only one of the in-phase and quadrature IF signals, the need for a complex (or polyphase) ADC and complex channel filters is eliminated thereby enabling considerable savings in power consumption. Such a receiver is particularly suitable for multi-mode operation in which one mode uses a low IF and another mode uses a zero IF, because design of non-complex ADCs to operate with a range of different clock speeds and noise-shaping profiles is much simpler than design of their complex counterparts.

By quantising only the I or Q component of the IF output from the receiver front-end, the wanted signal bandwidth is effectively doubled to match the quantisation bandwidth of the single ADC being reflected about zero frequency. However, despite a likely increase in clock speed resulting from this increased bandwidth the overall power consumption should be reduced since only a single ADC is used.

Because of a lack of image rejection by a non-complex ADC, a complex filter is required prior to the ADC. Such a filter may be a passive polyphase filter which, being passive, consumes no extra power.

In a preferred embodiment, the ADC is a sigma-delta ADC. In another preferred embodiment, the digital in-phase and quadrature signals are derotated to translate their frequency to baseband.

In a further embodiment of the invention the receiver is implemented in an integrated circuit.

The present invention is based upon the recognition, not present in the prior art, that use of non-complex ADC and channel filters in a low-IF receiver is possible provided image rejection filtering is performed on the IF signals prior to sampling and digitisation.

Embodiments of the present invention will now be described, by way of example, with reference to the accompanying drawings, wherein.

In the drawings the same reference numerals have been used to indicate corresponding features.

Figure 1:
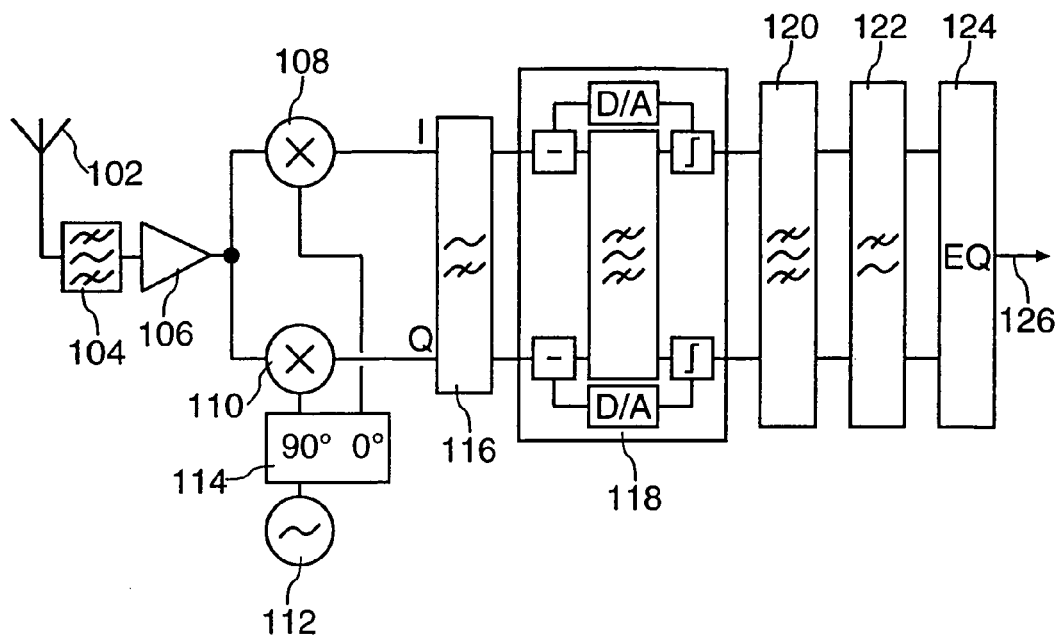
FIG. 1 is a block diagram of a known low-IF receiver architecture, as described above.
Figure 2:
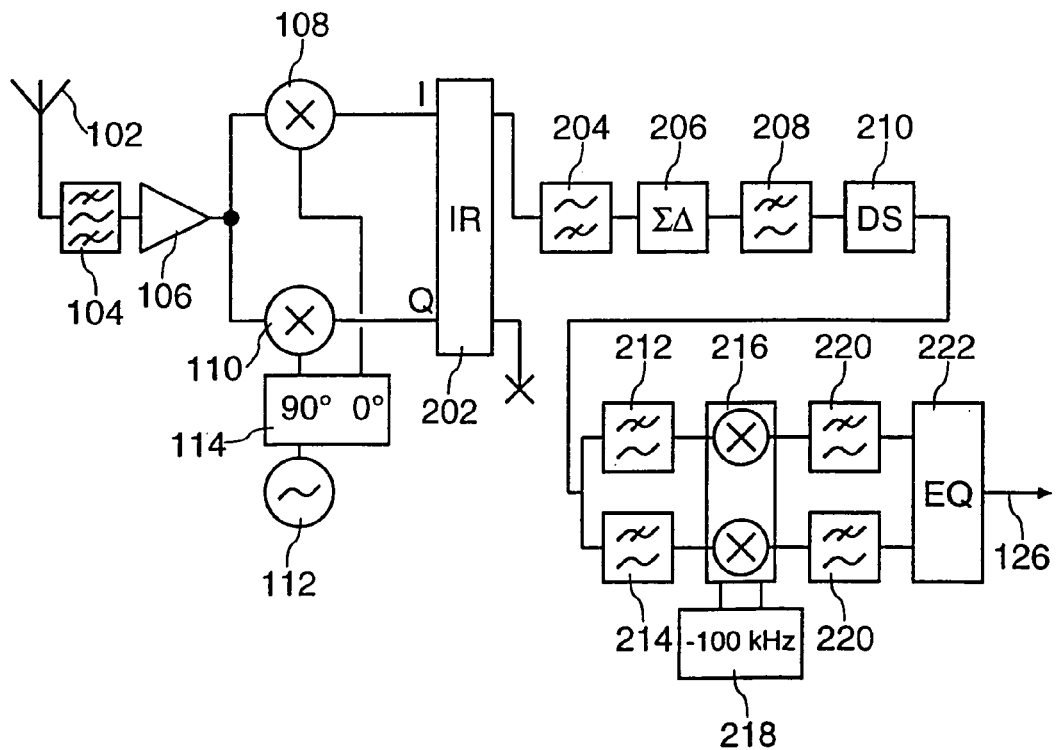
FIG. 2 is a block diagram of a low-IF receiver architecture made in accordance with the present invention.

FIG. 2 is a block diagram of a GSM embodiment of a low-IF receiver architecture made in accordance with the present invention. The front end uses a quadrature downconverter to mix incoming RF signals down to a low IF of half the channel spacing (for GSM the channel spacing is 200 kHz and hence the IF is 100 kHz). This part of the receiver is essentially the same as that described above with reference to FIG. 1 and will not be described again.

Figure 3:
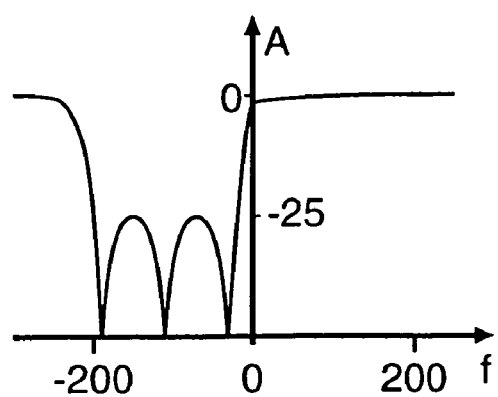
FIG. 3 is a graph illustrating the attenuation (A) in dB against frequency (f) in kHz of the image rejection filter in the architecture of FIG. 2.

After downconversion by the mixers 108,110 the complex low-IF signal, comprising I and Q signals, passes into an image rejection filter (IR) 202, which is a passive polyphase filter which rejects any interferer present in the image band of the wanted signal, namely between −200 kHz and 0 Hz. Such filters are known, as disclosed for example in the paper "Single sideband modulation using sequence asymmetric polyphase networks" by M J Gingell, Electric Communications, No 48, 1973. Passive polyphase filters are easily realised as an RC network which is straightforward to integrate on silicon. The image rejection filter 202 passes wanted signals in the band 0 Hz to +200 kHz as well as all other interferers. However, by eliminating any image interference it allows all subsequent filters in the receiver to be "real" (i.e. to operate on just one of the I and Q signals). An example of the frequency response of a suitable polyphase filter is shown in FIG. 3.

After the image rejection filter 202 the Q component of the signal is terminated, while the I component continues through a high pass filter 204 to a single, two port sigma-delta (ΣΔ) modulator 206. The effect of dropping the Q component of the signal is to take half of the wanted signal energy and fold it over onto the negative side of the frequency spectrum. Hence the signal (in common with the noise spectrum of the sigma-delta modulator 206) is symmetrical about zero frequency and occupies a bandwidth of 400 kHz. Such a signal maximises the conversion efficiency of the modulator 206.

The high pass filter 204 removes DC offsets generated by the preceding front-end circuitry. Studies of polyphase receivers for GSM applications have shown that a suitable cut-off frequency for the filter 204 is 6 kHz, which gives the receiver an adequate recovery time from the over-drive effects of large signals without causing any significant degradation of the wanted signal.

The order of the modulator 206 and its clock speed must be chosen to give the required noise shaping. At minimum input signal level (−108 dBm in the state of the art), signal-to-quantisation-noise ratio must be about 17 dB in a 400 kHz bandwidth (i.e. −200 kHz to +200 kHz) in order to meet the GSM specification for BER (Bit Error Rate). This figure is derived from the need for an overall signal-to-noise ratio of 7 dB and a quantisation noise level which is 10 dB below that of the front-end noise. The largest input signal to the ADC is a blocking interferer at −23 dBm.

Figure 4:
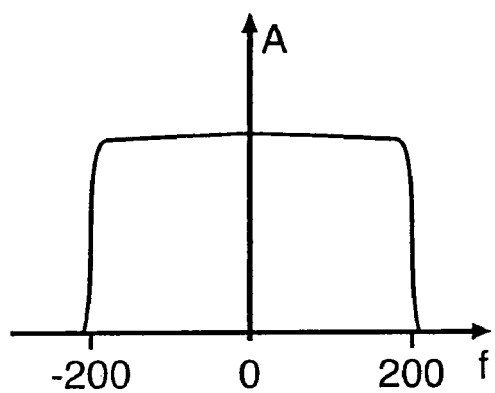
FIG. 4 is a graph illustrating the attenuation (A) against frequency (f) in kHz of the channel filter in the architecture of FIG. 2.

The digital output signal from the modulator 206 is filtered by a digital channel filter 208. This filter runs at a sampling rate equal to the clock rate of the sigma-delta modulator 206, which is typically of the order of 48 times the bit rate for GSM. It has a low pass frequency response with a cut-off frequency of approximately 200 kHz which, when viewed on a double-sided frequency axis, resembles a bandpass response of width 400 kHz. Such a frequency response is illustrated in FIG. 4. The filter 208 has the dual role of attenuating all interferers arriving at the receiver input except an image interferer (i.e. an interferer in the lower adjacent channel, which is handled by the image rejection filter 202) and of attenuating most of the wideband quantisation noise produced by the modulator 206.

Figure 5:
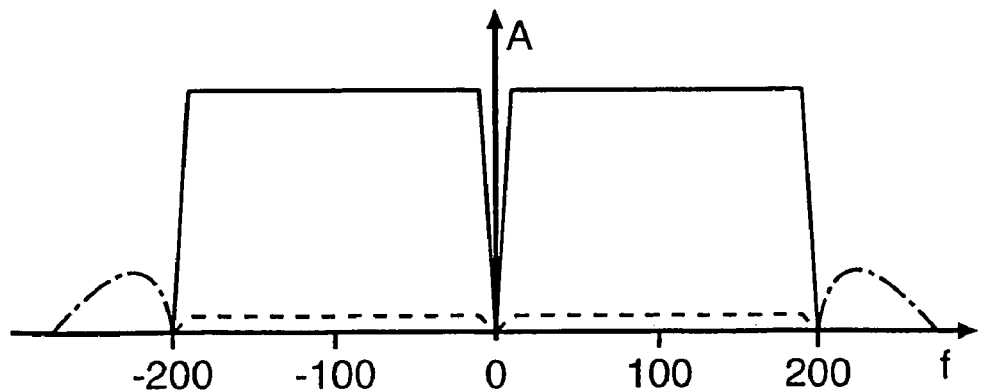
FIG. 5 is a graph illustrating the amplitude (A) against frequency (f) in kHz of signals at the output of the channel filter.

A typical frequency spectrum of signals at the output of the filter 208 is shown in FIG. 5. The two halves of the wanted signal, shown as a solid line, are located on either side of zero frequency, separated by the hole produced by the high pass filter 204. The residue of an image interferer, shown as a dashed line, occupies the same frequency space as the wanted signal but at a level that should be insignificant because of the attenuation applied by the image rejection filter 202. Outside the −200 kHz to +200 kHz band there may also be some residual sigma-delta noise, shown as a chain-dashed line, and power due to large interferers, but such signals can be removed easily by subsequent filtering.

Once the high frequency content of the signal has been removed by the channel filter 208 the IF signal can be down-sampled (i.e. decimated) by a down-sampling block (DS) 210 to a sampling rate of approximately four times the GSM bit rate. This reduces the required processing resources and power consumption for the reconstruction of the Q component of the wanted signal. It is necessary to make the wanted signal complex again to facilitate its perfect frequency translation (or de-rotation) back from the low IF to zero frequency, and its subsequent demodulation to obtain data bits.

Hence, after down-sampling, the signal is made complex by passing it to a pair of FIR filters, a first filter 212 having a linear-phase low pass response and a second filter 214 having an identical response except for the creation of a narrow notch in the middle of the passband and the insertion of an extra 90° phase shift (the phase shift being +90° for negative frequencies and −90° for positive frequencies). The second filter 214 creates the new Q component, performing the equivalent of a time-bounded Hilbert transform, with the width of the notch determining the length of its impulse response. A width of slightly less than or equal to that of the notch generated by the preceding high-pass filter 204 would normally be appropriate.

Figure 6:
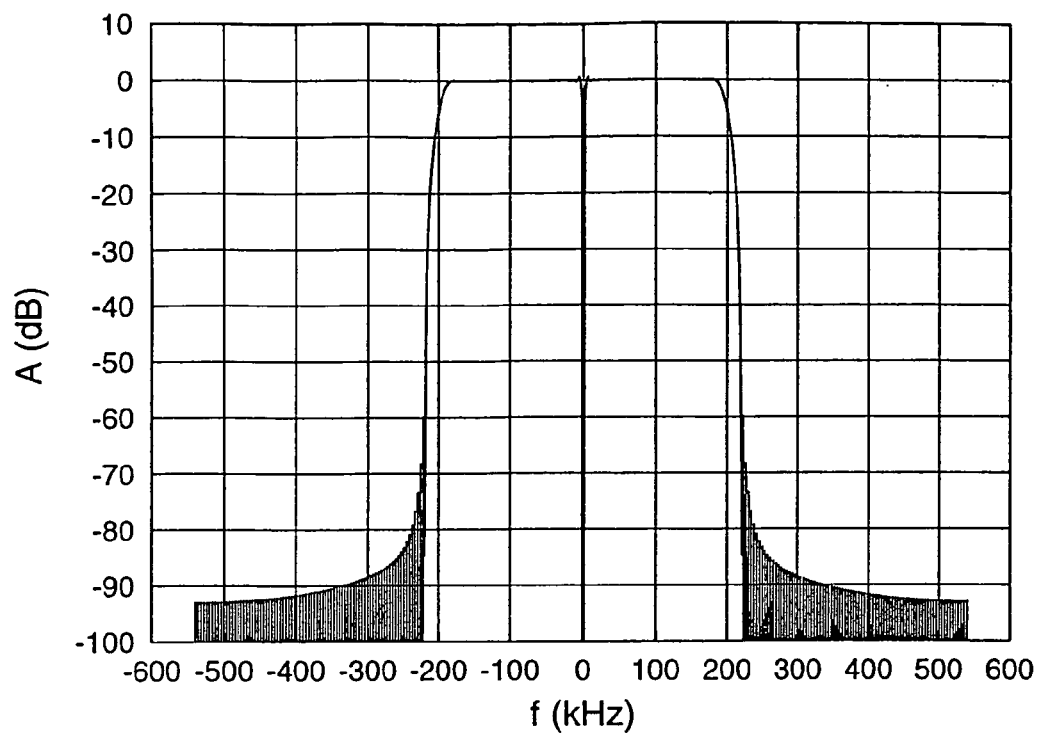
FIG. 6 is a graph illustrating the attenuation (A) against frequency (f) in kHz of a quadrature reconstruction filter.

FIG. 6 shows a typical frequency response of a suitable second filter 214, this particular example being a FIR filter having 276 taps, with a hole width of 8 kHz. The principal function of the first filter 212 is to insert exactly the same time delay into the path of the I component as that inserted in the path of the Q component by the second filter 214. The impulse response of both filters 212,214 should be exactly the same length. The first and second filters can be designed to give further suppression of any interference remaining after the channel filter 208 outside the bandwidth of the wanted signal. Changing their cut-off frequency has virtually no effect on the required length of the filters 212,214, and gives the possibility of introducing extra filtering that comes effectively for free. The choice of cut-off frequency has some relevance to the sampling rate required by the filters 212,214, but provided this does not give rise to any significant problems the filtering thereby provided may alleviate the need for any further filtering in the baseband.

Figure 7:
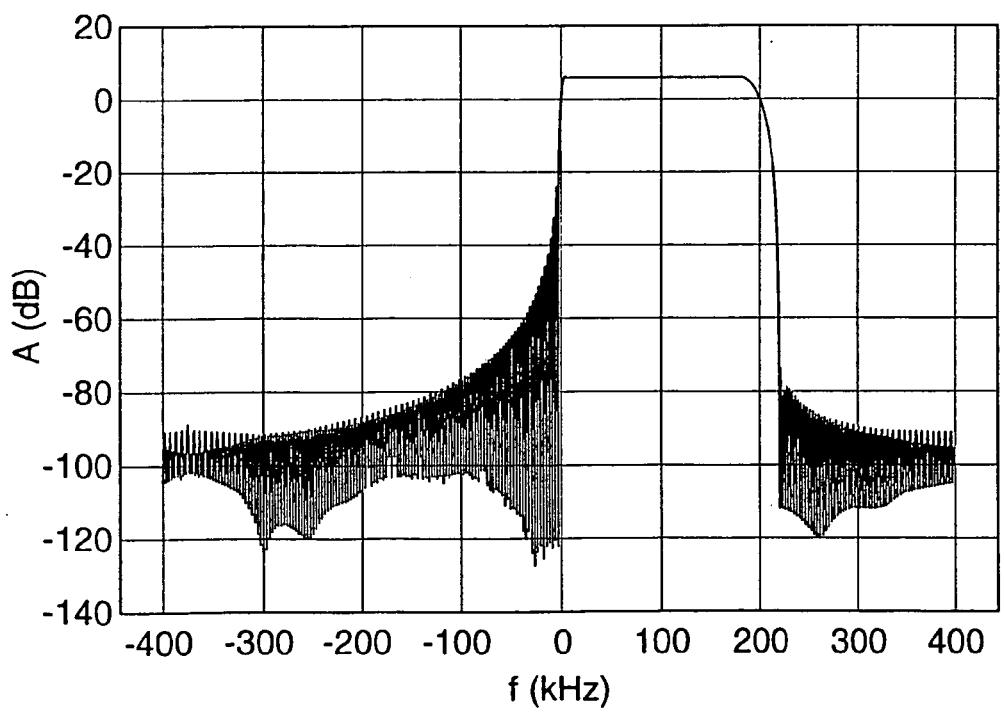
FIG. 7 is a graph illustrating the amplitude (A) against frequency (f) in kHz of a complex signal generated from a real signal by a pair of FIR filters.

Restoring the Q component of the wanted signal has the effect of folding the negative half of its frequency spectrum back onto the positive side, whereby the bandwidth reduces back to 200 kHz. The total power in the signal therefore returns to the original value seen at the input to the image rejection filter 202. The power density is increased by 6 dB. The complex frequency response of the combined output of the filters 212, 214 is shown in FIG. 7.

Once the Q component has been created, the I and Q signals pass to a derotation block 216 where they are derotated to baseband, by performing a complex multiplication with a complex tone of −100 kHz provided by a signal source 218, which derotation shifts the wanted signal back to a central frequency of zero.

Figure 8:
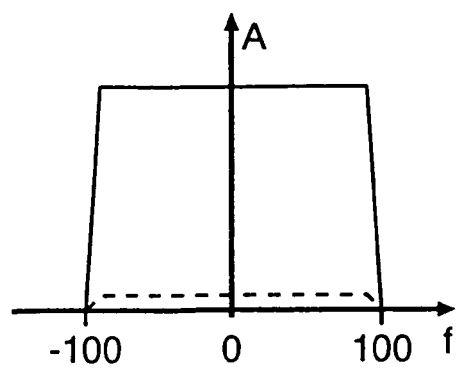
FIG. 8 is a graph illustrating the amplitude (A) against frequency (f) in kHz of signals immediately before equalisation and demodulation.

In the example embodiment shown in FIG. 2, the I and Q signals are filtered by respective low pass baseband filters 220, having a cut-off frequency of 80 kHz. A typical frequency spectrum of signals at the output of a filter 220 is shown in FIG. 8, with the wanted signal shown as a solid line and the residue of an image interferer shown as a dashed line.

The signals are then processed by an equalisation and demodulation block (EQ) 222 before being provided as output 126 to digital signal processing circuitry in the remainder of the receiver.

Figure 9:
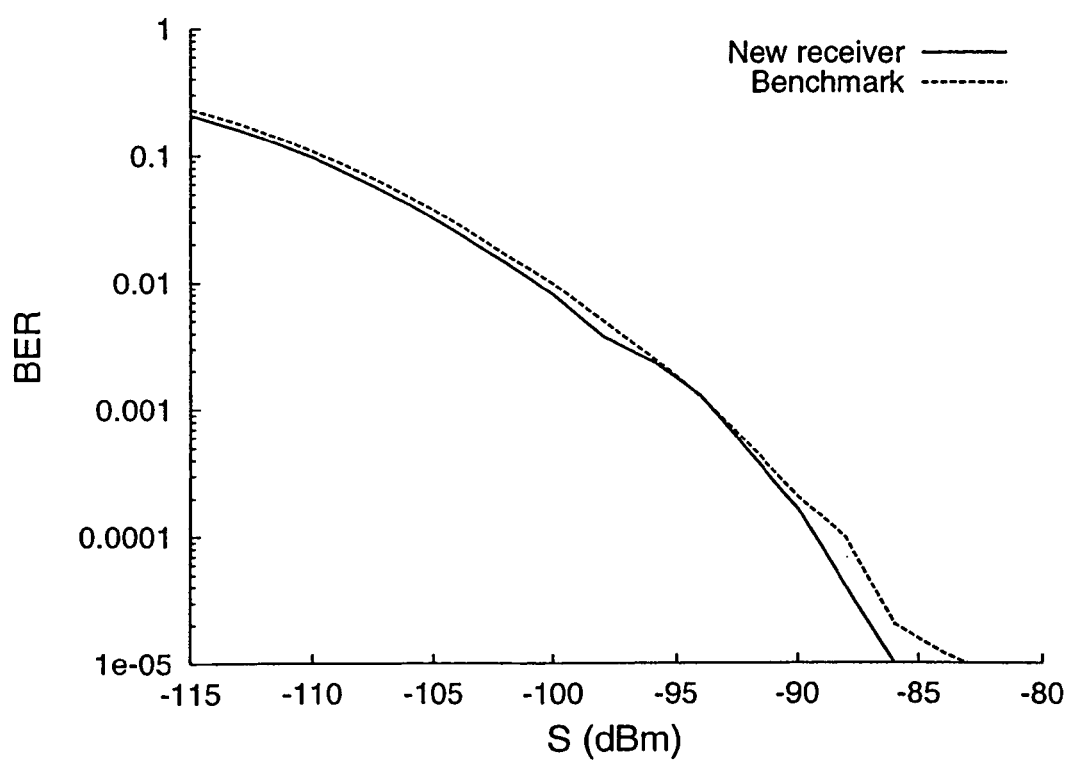
FIG. 9 is a graph of simulated bit error rate (BER) against signal power (S) in dBm for the receiver architecture of FIG. 2.

System simulations have been performed to verify the correct functioning of an architecture in accordance with the present invention. As an example, FIG. 9 is a graph of results of a simulation determining BER for a range of wanted signal powers S, in dBm, using a well-known TU50 channel model (typical urban profile with a maximum speed of 50 km/h). Simulated results for the new receiver architecture are shown as a solid line, while results for a benchmark polyphase receiver, using complex signal processing throughout, are shown as a dashed line. It is evident that the sensitivity of the new receiver is at least as good as the benchmark polyphase receiver. Other simulations have also verified that the new architecture can provide the required selectivity, both for adjacent channels and for those at larger frequency offsets.

In a variation on the embodiments described above, the channel filter 208 and complex signal reconstruction filters 212,214 are combined into a single filtering block comprising two FIR filters. Such an embodiment can require less digital hardware resources as the combined filtering block can exploit the bit-stream property of the output of the sigma-delta modulator 206. In effect, the functions of the channel filter 208 and down-sampling block 210 are incorporated in the filters 212,214.

To determine the required frequency response of the filters 212,214, it is simpler to consider the filters as a single complex filter, having an asymmetrical response about zero frequency, rather than two real filters one of which is the Hilbert transform of the other. Using a standard digital synthesis tool, a single, real FIR filter can be designed having the required bandwidth and selectivity. Obtaining the complex response is then a straightforward matter of applying a +100 kHz frequency shift. Real and imaginary impulse responses can be obtained by performing an inverse discrete Fourier transform on the shifted frequency response.

Figure 10:
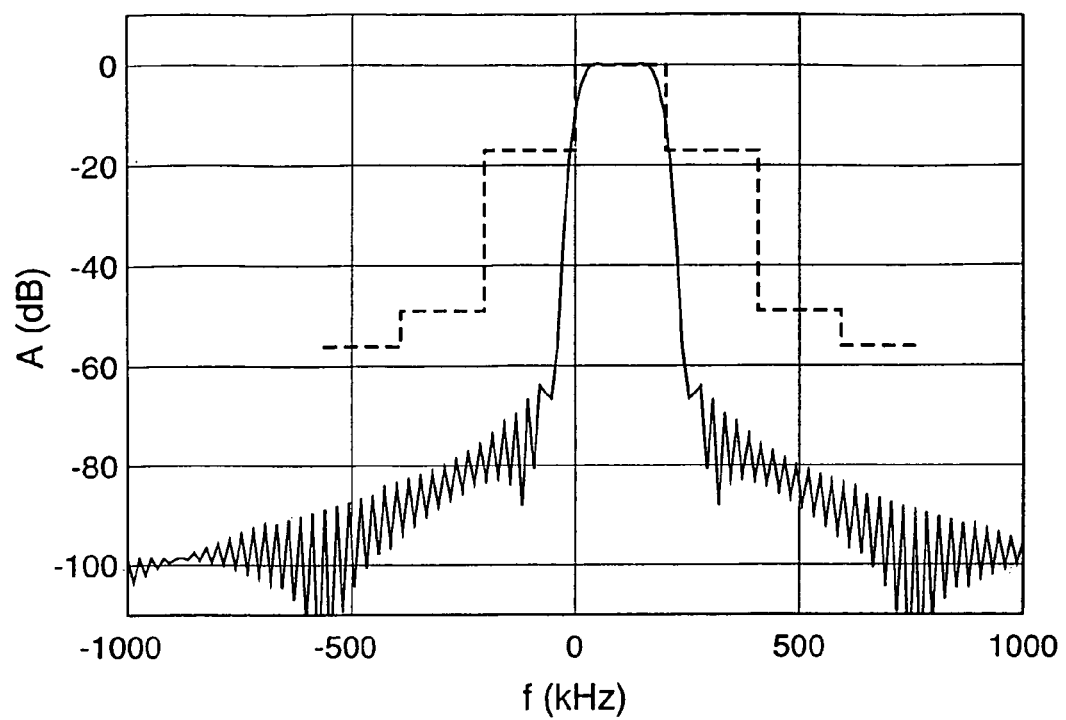
FIG. 10 is a graph illustrating the attenuation (A) against frequency (f) in kHz of a combined channel filter and quadrature reconstruction filter.

FIG. 10 illustrates the complex frequency response of a suitable pair of filters 212,214, obtained after a small number of design iterations. The required attenuation template is shown as a dashed line. The response displays a very small ripple over the passband, from 20 kHz to 180 kHz, with a stopband attenuation that is well within the bounds of the template (exceeding 100 dB at frequencies beyond ±1 MHz). Such a response permits the filters 212,214 to pass the wanted signal with minimal distortion, apply sufficient attenuation to adjacent- and alternate-channel interferers and reject most of the high frequency noise generated by the sigma-delta modulator 206.

The receiver architecture described above has a similar range of applications to that of known near-zero IF polyphase architectures, including second generation cellular systems such as GSM, AMPS, IS136 and PDC1900 and cordless systems such as DECT and Bluetooth. In these applications a useful power saving can be achieved. The architecture is even more useful for receivers having a joint CDMA/TDMA multi-mode capability. As a particular example, one application is a dual-mode UMTS/GSM receiver in which the IF switches between zero and 100 kHz. Other applications, such as a CDMA2000/IS95/IS136/AMPS receiver, are also envisaged.

The invention claimed is:

1. A radio receiver comprising an input for a radio frequency signal, quadrature down-conversion means for translating the radio frequency signal to an intermediate frequency and for generating in-phase and quadrature versions of the intermediate frequency signal which is capable of having a zero or a nonzero value, complex filtering means for operating on the in-phase and quadrature signals to provide filtered in-phase and quadrature signals, analogue-to-digital conversion means for digitising only one of the in-phase and quadrature signals, means for performing digital signal processing on the digitised signal and signal generation means for operating on the processed signal to generate digital in-phase and quadrature signals.

2. A receiver as claimed in claim 1, characterised in that the complex filtering means comprises a passive polyphase filter.

3. A receiver as claimed in claim 1, characterised in that the analogue-to-digital conversion means comprises a sigma-delta analogue-to-digital converter.

4. A receiver as claimed in claim 1, characterised in that the analogue-to-digital conversion means are operable at a plurality of different clock speeds.

5. A receiver as claimed in claim 1, characterized in that the intermediate frequency may be either low or zero.

6. A receiver as claimed in claim 5, characterised in that the radio frequency signals conform to a cellular communication standard and in that the low intermediate frequency is half of the channel spacing specified in the standard.

7. A receiver as claimed in claim 1, characterised in that derotation means are provided for translating the digital in-phase and quadrature signals to baseband.

8. A receiver as claimed in claim 1, characterised in that the signal generation means comprises first and second filters and in that the phase shift applied to signals passed through each of the filters differs by 90°.

9. A receiver as claimed in claim 8, characterised in that the filters have a linear-phase characteristic.

10. A receiver as claimed in claim 1, characterised in that the combination of the means for performing digital signal processing and the signal generation means is provided by first and second filters.

11. An integrated circuit comprising a radio receiver as claimed in claim 1.

* * * * *